United States Patent [19]

Vergason

[11] Patent Number: 5,037,522
[45] Date of Patent: Aug. 6, 1991

[54] ELECTRIC ARC VAPOR DEPOSITION DEVICE

[75] Inventor: Gary E. Vergason, Spencer, N.Y.

[73] Assignee: Vergason Technology, Inc., Van Etten, N.Y.

[21] Appl. No.: 556,429

[22] Filed: Jul. 24, 1990

[51] Int. Cl.[5] .............................................. C23C 14/22
[52] U.S. Cl. ............................ 204/298.41; 204/192.38
[58] Field of Search ..................... 204/192.13, 192.38, 204/298.03, 298.41

[56] References Cited

U.S. PATENT DOCUMENTS

| | | | |
|---|---|---|---|
| 3,625,848 | 12/1971 | Snaper | 204/192 |
| 3,783,231 | 1/1974 | Sablev et al. | 204/298.41 X |
| 3,793,179 | 2/1974 | Sablev et al. | 204/298.41 |
| 3,922,214 | 11/1975 | Van Cakenberghe | 204/298 |
| 4,407,712 | 10/1983 | Henshaw et al. | 204/298 |
| 4,430,184 | 2/1984 | Mularie | 204/298.41 X |
| 4,492,845 | 1/1985 | Kljuchko et al. | 204/298.41 X |
| 4,609,564 | 9/1986 | Pinkhasov | 427/37 |
| 4,814,056 | 3/1989 | Welty | 204/298 |
| 4,849,088 | 7/1989 | Voltrop et al. | 204/298 |
| 4,859,489 | 8/1989 | Pinkhasov | 427/37 |

Primary Examiner—Nam X. Nguyen
Attorney, Agent, or Firm—Jones, Tullar & Cooper

[57] ABSTRACT

An electric arc vapor deposition device is disclosed in which the negative side of an arc power supply is switched back and forth between the two ends of a cylindrical cathode to cause an arc struck between an anode and the cathode to travel back and forth along the length of the cathode. Adjustably positioned proximity sensors are disposed adjacent the two ends of the cathode to sense the presence of the arc and cause a switching circuit to change the power supply connection from one cathode end to the other. The cylindrical shape of the cathode causes the arc to spiral around the cathode as it travels along its length thus causing a very uniform erosion of material off of the cathode's surface. Since the arc is allowed to travel substantially along the entire length of the cathode, use of a relatively long cathode permits large articles or quantities of articles to be coated evenly. In addition, the cathode can be coaxially located within a hollow article, such as a tube or pipe, to coat the inner surfaces of the article.

11 Claims, 4 Drawing Sheets

ELECTRIC ARC VAPOR DEPOSITION DEVICE

BACKGROUND OF THE INVENTION

The present invention relates in general to an electric arc vapor deposition device for depositing coatings on various types of articles.

Electric arc vapor deposition devices employ a high current electric arc to evaporate material off of a cathode and form a vapor, which is then deposited on articles to be coated. Examples of these types of devices are disclosed in Sablev U.S. Pat. Nos. 3,783,231 and 3,793,179 and Mularie U.S. Pat. No. 4,430,184. In the devices set forth in these patents, a power supply is used to strike and sustain an arc between an anode and a planar metal cathode disposed in an evacuated chamber. As the arc travels along the cathode, the cathode metal, such as titanium, is vaporized, reacted with nitrogen and used to coat articles in the chamber, such as gears, cutting tools and machine parts. A problem with these types of devices is that the arc wanders erratically across the face of the cathode and causes an uneven consumption of the cathode material which reduces its life expectancy. In addition, a means must be provided to prevent the arc from wandering off of the cathode face and extinguishing or evaporating non-cathode material within the chamber.

In the Sablev et al. patents, a magnetic field is employed to help confine the arc so that the cathode is evenly eroded, and an anode referenced annulus is provided to extinguish the arc if it travels off of the cathode face. This leads to erratic operation of the source and requires numerous restrikings of the arc which generate very large particle emissions that, if included with the vaporized coating material, can cause a rough coating. The anode ring also requires maintenance because coating material quickly builds up on it which must be stripped periodically to prevent electrical short circuits.

In the device disclosed in the Mularie patent, an active boron nitride confinement ring is utilized to keep the arc on the cathode face. This boron nitride ring must be in intimate contact with the cathode or the arc will migrate into the interface between the two and extinguish. When fitted properly, the boron nitride ring allows the arc to continue operating by bouncing it back onto the cathode. A problem with this arrangement is that much larger particulate material is produced when the arc continues to operate on or near the boron nitride. This, combined with the higher amperages needed to maintain its operation, can lead to rough, contaminated thin film coatings.

In view of the foregoing, an electric arc vapor deposition device is needed which employs an improved arc confinement technique that does not suffer from the drawbacks of the prior art devices and provides a more uniform utilization of the cathode material to improve coating quality and extend the life of the cathode.

SUMMARY OF THE INVENTION

It is therefore the object of the present invention to provide an electric arc vapor deposition device in which the arc is maintained on a cathode without confinement devices that can cause the arc either to extinguish or to erode the cathode in an uneven manner.

It is another object of the present invention to provide an electric arc vapor deposition device in which an arc is caused to travel rapidly along the length of a large cathode so that even deposition of coatings on large articles or on a large number of articles can be obtained.

It is yet another object of the present invention to provide an electric arc vapor deposition device which can be fitted inside hollow articles, such as pipes or tubes, to provide even coatings on the inside surfaces thereof.

Another object of the present invention is to provide an electric arc vapor deposition device which employs a lower anode:cathode size relationship than in prior art devices so that a higher operating voltage, but lower current, is required which further improves coating uniformity and quality.

A still further object of the present invention is to provide an electric arc vapor deposition device in which the anode and cathode of the device are spaced substantially farther apart from one another than in previous devices to improve ionization rates and thereby also improve coating uniformity and quality.

These and other objects of the invention are achieved with an electric arc vapor deposition device in which a long, preferably cylindrical, cathode is employed. Disposed proximate to a first and a second end of the cathode are first and second arc sensors, respectfully. These sensors sense the presence of an electric arc on the cathode by sensing the electric or magnetic field generated thereby. The outputs of the sensors are employed to control a switching circuit which selectively connects the negative side of a power supply to either the first or second end of the cathode. When an arc is struck between the anode and cathode of the device, the arc spot will tend to travel rapidly around the exterior surface of the cathode and along its length. The arc sensors are employed to control the distance along the cathode length which the arc spot is allowed to travel. It has been found through experimentation that the arc spot will travel toward the end of the cathode that is connected to the negative side of the power supply. As a result, if an arc is struck at the first end of the cathode and the power supply is connected to the second end of the cathode, the arc spot will travel toward the second end of the cathode. This characteristic enables the arc spot in the present device to travel back and forth between the two ends of the cathode through use of the switching circuit which alternately connects the power supply first to one end of the cathode, and then to the second end of the cathode in response to the sensing of the presence of the arc spot by the arc sensors. Thus, as the arc spot travels toward the first end of the cathode and is sensed by the first arc sensor, the power supply connection will be switched to the second end of the cathode to cause the arc to reverse direction and travel back toward the second end, and so on.

By virtue of this arrangement, there is no need to employ any type of arc confinement mechanism with the present invention which would either cause uneven erosion of the cathode or extinguishment of the arc. Further, because the arc is allowed to travel over a long distance between the two cathode ends, uniform coating of large articles or large quantities of articles can be obtained with the device since the vapor formation by erosion of material off the cathode surface occurs over a large area. The cylindrical shape of the cathode also permits articles to be evenly coated by the uniform erosion of the cathode surface caused by the arc as it travels around the cathode. Further, this arrangement enables the present invention to be particularly suited for coating the interior surfaces of hollow articles, such as pipes or tubes. By using a long cylindrical cathode which is inserted into the interior of an article, an even coating of material can be deposited on the interior surface of the article by causing the electric arc to travel back and forth along the length of the cathode.

The present invention also employs an anode:cathode size ratio that is smaller than in previous devices so that operating voltage is correspondingly higher and the operating current is correspondingly lower. In particular, the anode is preferably about the same size as the cathode, although it can range from ¼ to 4 times the size of the cathode. In contrast, typical prior art devices employ anodes that are many times larger than the cathode. The advantage of using a smaller anode, is that the increased resistance of the anode requires a higher operating voltage but lower operating current to maintain the plasma of ions between the cathode and the anode. The lower operating current causes the particles being vaporized off of the cathode to be smaller, which results in smoother, more uniform coatings. In addition, prior devices typically employ cathode and anode spacings that are very small, on the order of a couple of inches. In the present invention, however, the cathode and anode are spaced considerably further from one another, for example 12 inches or more. This spacing increases the size of the ion plasma between the cathode and anode and thereby increases the ionization rate which also improves coating quality.

BRIEF DESCRIPTION OF THE DRAWINGS

The foregoing and additional objects, features and advantages of the present invention will become apparent from the following detailed description of preferred embodiments thereof, taken in conjunction with the accompanying drawings in which.

DETAILED DESCRIPTION OF THE PREFERRED EMBODIMENTS

Figure 1:
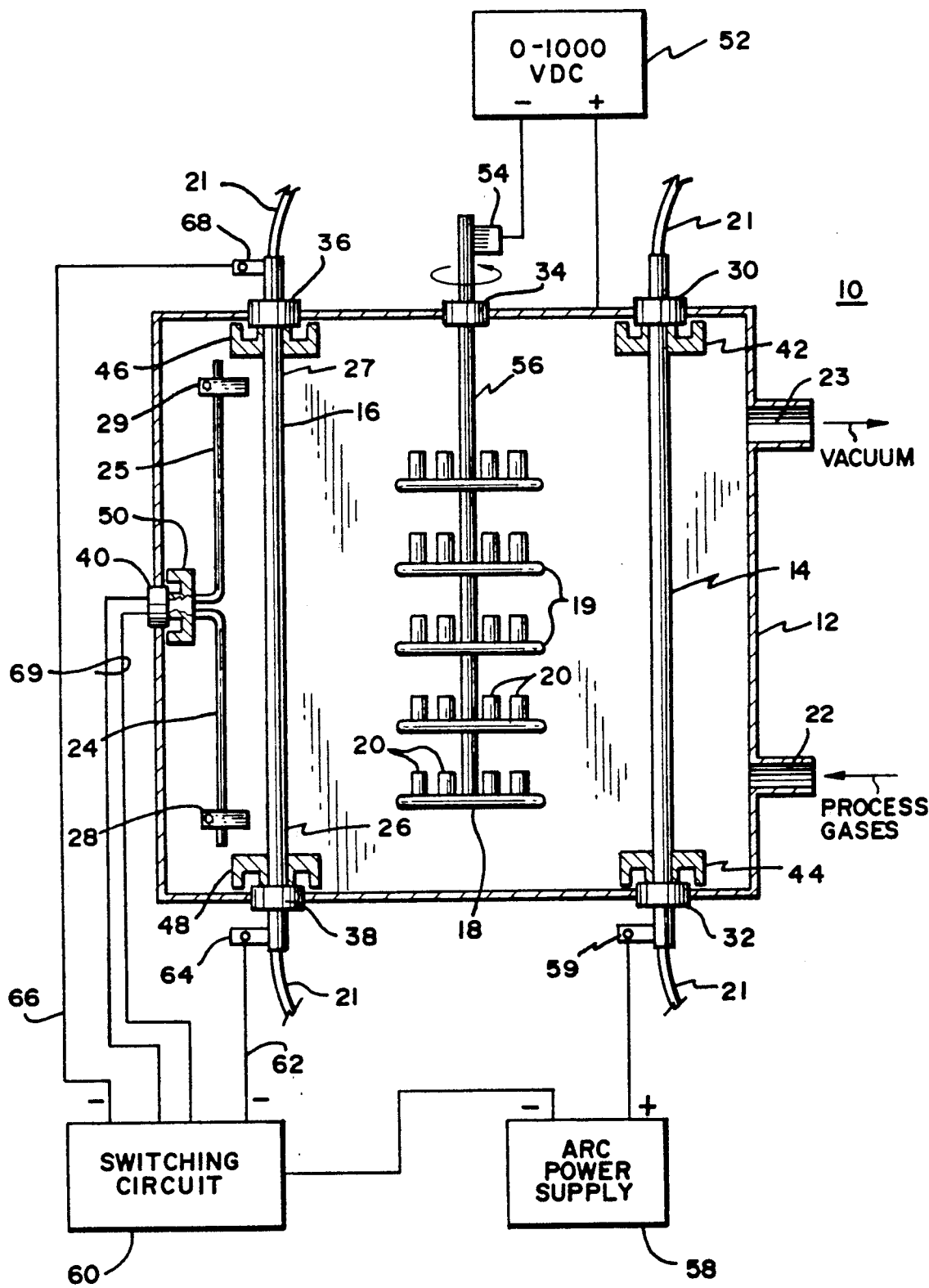
FIG. 1 is a diagrammatic illustration of an electric arc vapor deposition device constructed in accordance with a first preferred embodiment of the present invention.

Turning now to a more detailed consideration of the present invention, there is illustrated in FIG. 1, an electric arc vapor deposition device 10 which includes a vacuum chamber 12 containing two electrodes: an anode 14, and a cylindrical cathode 16, and a rotatable article support fixture 18 including a plurality of circular tiers 19 for supporting a plurality of articles 20 to be coated. Both the anode 14 and the cylindrical cathode 16 are preferably hollow so that a cooling fluid can be passed therethrough via a plurality of coolant lines 21 from a source of coolant (not shown). The anode 14 is preferably about the same size as the cathode 16, but can range from ¼ to 4 times as large as the cathode 16. In addition, the anode 14 and cathode 16 are preferably separated by a relatively large distance on the order of 12 inches or more. The anode:cathode size relationship and spacing are chosen to increase the required operating voltage and decrease the operating current of the device and the size of the resulting ion plasma so that the vaporized particle sizes are reduced and the ionization rates are increased. This improves the quality and uniformity of the resulting coating.

The cathode 16 is formed from metal, such as titanium, nickel or copper, etc. which is selected depending on the type of coating desired. Often, the articles 20 to be coated are gears, cutting tools or machine parts which are coated with a coating such as titanium nitride, that either increases their surface hardness or acts as a lubricant. In this case, the cathode is formed from titanium and nitrogen gas is introduced into the vacuum chamber 12 through a process gas port 22 disposed therein. A second port 23 is disposed in the vacuum chamber 12 which is connected a source of vacuum (not shown) to evacuate the chamber.

Also disposed within the vacuum chamber 12 are a pair of conductor rods 24 and 25 which are positioned parallel to the cathode 16 with the first rod 24 positioned adjacent a first end 26 of the cathode 16, and the second rod 25 positioned adjacent a second end 27 of the cathode 16. Adjustably attached to the rods 24 and 25 are first and second proximity sensor heads 28 and 29, respectively, which sense the presence of an arc spot on the cathode 16. Sensor heads 28 and 29 preferably are responsive to either the electric or magnetic fields generated by an arc, but can also be responsive to the heat or light generated by the arc. Each of the sensor heads 28 and 29 can be selectively positioned along the length of the cathode 16 as desired to control the positioning of an arc on the cathode 16 as described in further detail below.

A plurality of conventional electrically isolated vacuum feedthroughs 30–40 are utilized where the anode 14, cathode 16, article fixture 18 and conductive rods 24 and 25 pass through the walls of the vacuum chamber 12 to electrically insulate these elements from the chamber walls and provide the necessary seal to maintain a vacuum therein. A plurality of coating shielding structures 42–50 are disposed at the ends of the anode 14, cathode 16 and conductive rods 23 and 24 adjacent the feedthroughs 30, 32, 36, 38 and 40, respectively, which help prevent coating buildup from causing short circuits with the walls of the vacuum chamber 12.

A high voltage DC power supply 52 has a positive output connected to the vacuum chamber 12 and a negative output connected through a rotary contact brush 54 to a rotatable shaft 56 of the article support fixture 18. When the articles 20 to be coated are metal articles, such as gears or tools, the power supply 52 is employed to apply a negative voltage bias to the fixture support 18, and therefore to the articles 20, to improve the attraction of coating material to the articles. Typically, a negative voltage of between 500 and 1,500 volts DC is applied to the fixture support 18 for this purpose. In the case of non-metallic articles, no negative voltage bias is supplied by power supply 52.

An arc power supply 58 has a positive DC voltage output connected to a terminal 59 on the anode 14 and a negative DC voltage output connected to a switching circuit 60, which selectively connects the negative side of the power supply 58 either through a first connection line 62 to a terminal 64 on the first end 26 of the cathode 16, or through a second connection line 66 to a terminal 68 on the second end 27 of the cathode 16, depending on the sensed position of an arc thereon. Signals from the sensors 28 and 29 are sent to the switching circuit 60 for this purpose through a pair of lines 69. Typically, when cathode 16 is titanium, 40–100 amps DC are needed to strike the arc, while 10–50 amps are needed to sustain it. In the case of an anodic arc deposition device where material is evaporated off of the anode instead of the cathode, the power supply connections would be reversed and the cathode 16 would act as the anode and vice/versa.

Figure 2:
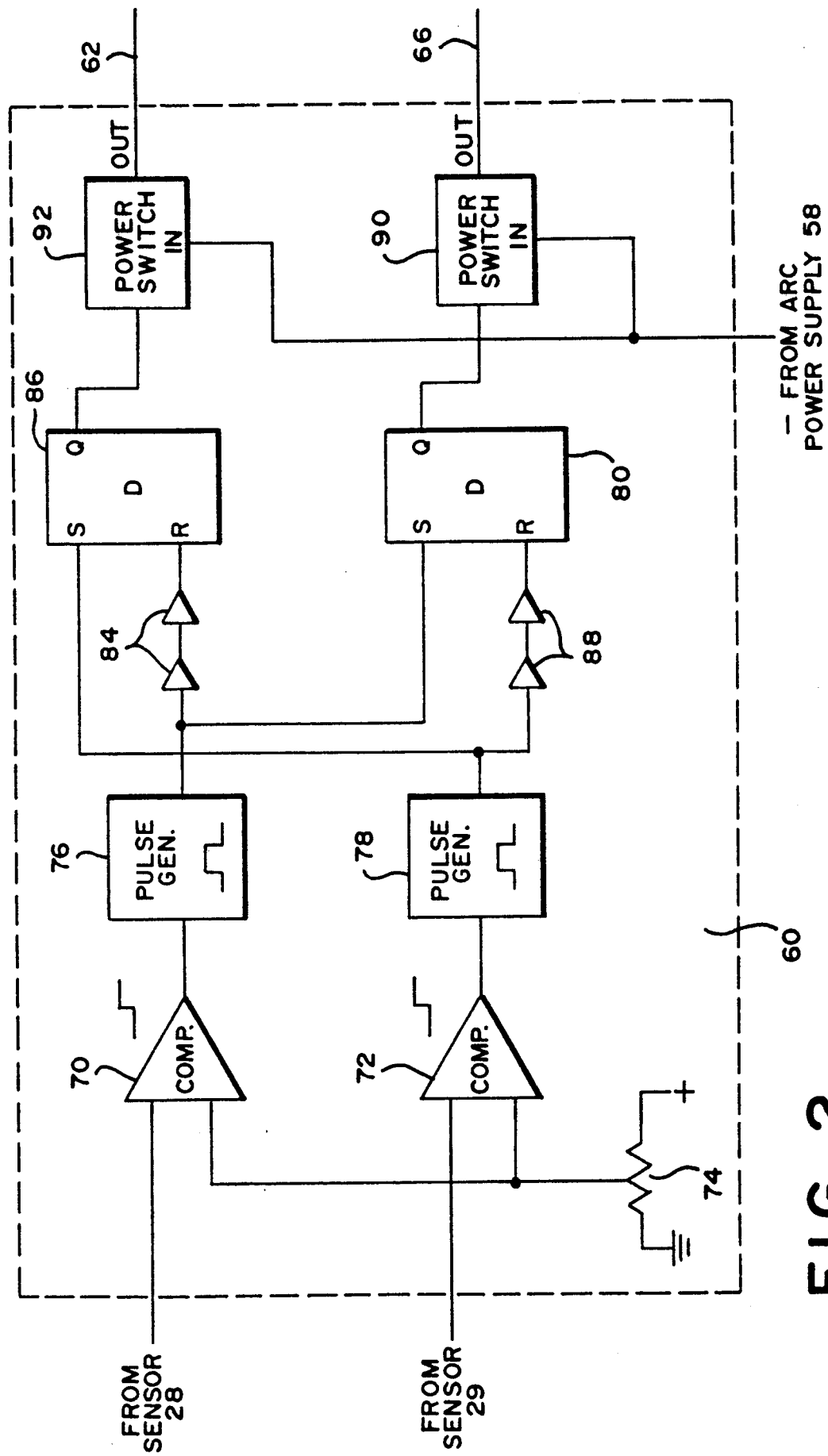
FIG. 2 is a schematic circuit diagram of a switching circuit used with the preferred embodiments of the present invention.

The switching circuit 60 is illustrated in detail in FIG. 2 and includes a pair of comparators 70 and 72 which compare the signals received from the sensors 28 and 29, respectively, to an adjustable threshold voltage received from a potentiometer 74. The outputs from the comparators 70 and 72 are fed to a pair of corresponding pulse generator circuits 76 and 78, respectively.

When a signal is received from the sensor 28 in response to the approach of the arc spot toward the first end 26 of the cathode 16, the output of the comparator 70 will go high and cause the pulse generator 76 to send a pulse to the SET input of a first D type flip-flop 80, and through a first pair of buffers 84 to the RESET input of a second D type flip-flop 86. Similarly, a signal from the sensor 29 will cause the pulse generator 78 to send a pulse to the SET input of the second flip-flop 86, and through a second pair of buffers 88 to the RESET input of the first flip-flop 80. The Q outputs of flip-flops 80 and 86 are in turn connected to the control inputs of a pair of power switches 90 and 92, respectively, which connect the negative side of arc power supply 58 to the cathode connection lines 66 and 62, respectively.

Thus, for example, when the first sensor 28 senses the approach of the arc spot, the first flip flop 80 will be set and cause the power switch 90 to connect the negative side of the power supply 58 to the second end 27 of the cathode 16, while a short time period later as determined by the gate delay of the buffers 84, the second flip-flop 86 will be reset and cause the power switch 92 to disconnect the negative side of the power supply 58 from the first end 26 of the cathode 16. Similarly, a signal from the second sensor 29 causes the power switch 92 to connect the first end 26 of the cathode 16 to the power supply 58, and then causes the power switch 90 to disconnect the second end 27 of the cathode 16 from the power supply 58. The overlap period caused by the gate delay of the buffers 84 and 88, during which both ends of the cathode 16 are connected to the arc power supply 58, insures that there will be no interruption of the connection to the cathode 16 which could cause extinguishment of the arc.

In the operation of the electric arc vapor deposition device 10, an arc is struck on the cathode 16 and a plasma is maintained between the anode 14 and cathode 16 with the arc power supply 58. This causes molten pools of material to be formed at the spot where the arc strikes the surface of the cathode 16 which then explode into a plasma of ions and atoms and react with the gas in the chamber 12 to form a vapor of coating material that is then deposited on the articles 20. The particular type of coating is therefore determined by the cathode material and the gas. For example, if a titanium cathode is employed in conjunction with nitrogen gas, titanium nitride vapor is formed.

The arc spot will naturally tend to spiral around the surface of the cylindrical cathode 16 and travel along its length. It has been found through experimentation, that the arc travels along the cathode toward the end to which the negative lead of the arc power supply 58 is connected. Thus, if the negative lead of the arc power supply 58 is connected to the first end 26 of the cathode 16, the arc will tend to travel slowly toward that end. In the present invention, as the arc approaches the first end 26, the first proximity sensor 28 will sense the electric or magnetic field being generated by the arc and cause the switching circuit 60 to connect the negative lead of the power supply 58 to the second end 27 of the cathode 16, and then disconnect the negative lead from the first end 26. This will then cause the arc to begin traveling along the cathode 16 in the opposite direction toward the second end 27. As the arc approaches the second end 27, the second proximity sensor 28 will sense this and cause the switching circuit 60 to once again change the connections to the cathode 16. In this manner, the arc on the cathode 16 is caused to travel back and forth between the two proximity sensors 28 and 29 thereby providing both a uniform erosion of the coating material from the cathode 16 and a uniform deposition of the coating material on the articles 20. The rotation of the article fixture 18 further aids in the uniform deposition of the coating material.

Figure 3:
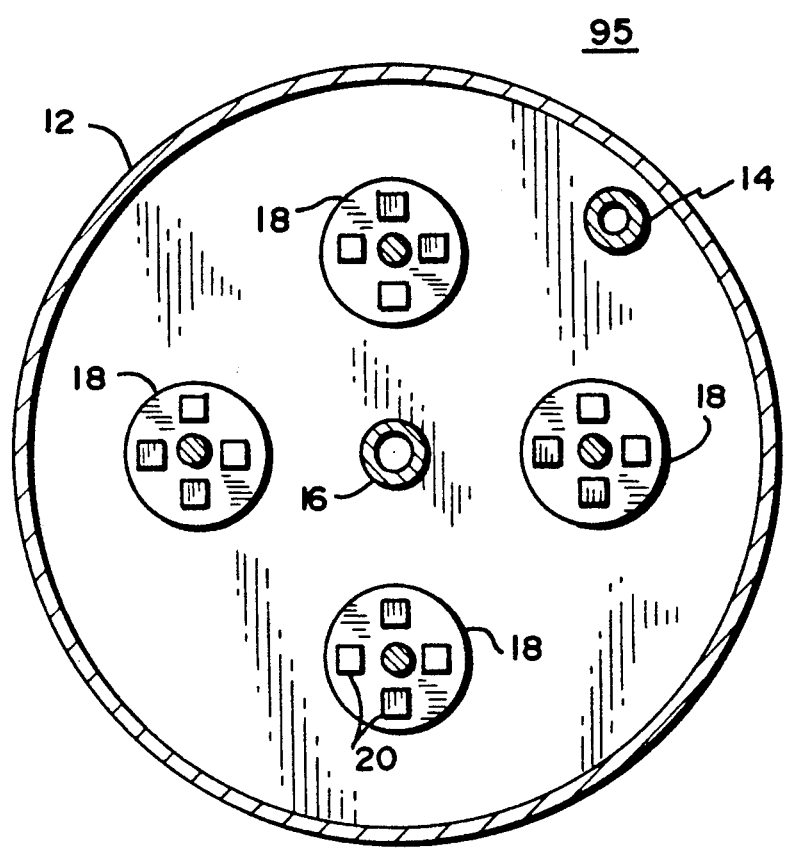
FIG. 3 is a diagrammatic cross sectional top view of a second preferred embodiment of the present invention.

The cylindrical shape of the cathode 16 also permits articles to be spaced around the entire periphery of the cathode as illustrated in FIG. 3, which shows an alternative embodiment of the present invention. In particular, an electric arc vapor deposition device 95 is shown in which the vacuum chamber 12 is made larger and the hollow cathode 16 is centrally disposed 15 therein, while the anode 14 is disposed near the wall of the chamber 12. A plurality of the rotatable article support fixtures 18 are evenly spaced around the cathode 16. When an arc is struck between the anode 14 and cathode 16, the arc spot will move around the entire periphery of the cathode 16 and in the process, generate a vapor of coating material in all directions, which will then evenly coat the articles 20 on each of the article support fixtures 18.

Figure 4:
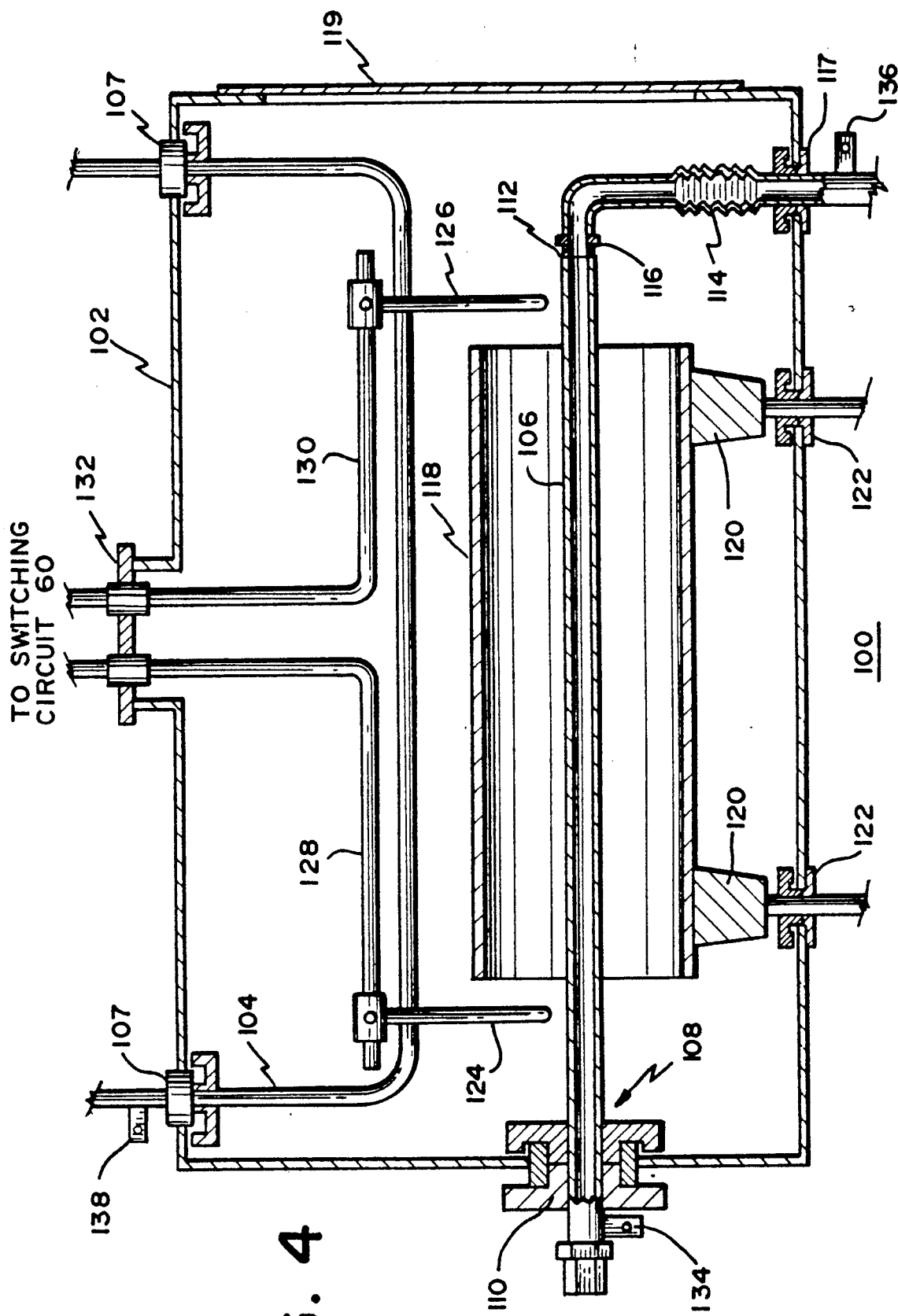
FIG. 4 is a cross sectional diagrammatic illustration of an electric arc vapor deposition device constructed in accordance with a third preferred embodiment of the present invention.

Since the arc is allowed to travel back and forth along the length of the cathode, the present invention is also useful for coating the interior surfaces of hollow articles, such as pipes or tubes. This is accomplished by disposing a cylindrical cathode within the article to be coated and then allowing an arc to travel back and forth along the cathode so that the interior of the article is uniformly coated by the vapor generated by the arc. In FIG. 4, an electric arc discharge device 100 is illustrated which is constructed in accordance with this technique. In particular, the device 100 includes a vacuum arc chamber 102 which contains two electrodes: an anode 104 and a hollow cylindrical cathode 106. The anode 104 is supported within the chamber 102 by means of a pair of electrically isolated vacuum feedthroughs and arc shield assemblies 107. Similarly, the cathode 106 is supported at a first end 108 by means of an electrically isolated vacuum feedthrough and coating shield assembly 110, and at a second end 112 by a flexible conductor 114 which is removably connected (as required) to the cathode 106 by means of a union 116. Another feedthrough and shield assembly 117 is positioned where the conductor 114 passes through the wall of the chamber 102. As illustrated, the cathode 106 is coaxially located within a hollow article 118 to be coated, and the union 116 and flexible conductor 114 permit the hollow article 118 to be positioned in, and removed from, the chamber 102 via a removable hatch 119 disposed in one end of the chamber 102.

The hollow article 118 to be coated is supported within the chamber 102 by means of a pair of conductive holders 120, which in turn are connected to a corresponding pair of high voltage insulated feedthroughs 122. The holders 120 can be connected to a high voltage DC power supply (not shown) which is similar to the power supply 52 of FIG. 1 and places a negative voltage bias on the article 118 if it is conductive.

Similar to the embodiment of FIG. 1, first and second arc proximity sensor heads 124 and 126 are disposed adjacent the first and second ends 108 and 112 of cathode 106, respectively, to sense the approach of an arc spot. Each of the sensor heads 124 and 126 are adjustably secured to one of a pair of corresponding conductor rods 128 and 130, respectively, which in turn pass through a double insulated vacuum feedthrough 132 in the vacuum chamber 102 to the switching circuit 60 of FIG. 2. A first conductor clamp 134 is disposed adjacent the first end 108 of cathode 106 for securing a first power supply conductor (not shown) from the switching circuit 60, while a second conductor clamp 136 is attached to the flexible conductor 114 outside the chamber 102 for securing a second power supply conductor (not shown) from the switching circuit 60. Similarly, a third conductor clamp 138 is attached to one end of the anode 104 for connecting the positive side of an arc power supply thereto.

The operation of the embodiment of FIG. 4 is similar to that of the embodiment of FIG. 1 with the exception that the arc travels back and forth along the cathode 106 within the article 118 to be coated. Since the arc spirals around the periphery of the cathode 106 and travels along the entire length of the article 118, a uniform coating of the article's inner surface is obtained.

Although the invention has been disclosed in terms of preferred embodiments, it will be understood that numerous variations and modifications could be made thereto, without departing from the true spirit and scope of the invention as set forth in the following claims.

What is claimed is:

1. An electric arc vapor deposition device comprising:
    a) a chamber for receiving articles to be coated;
    b) a first electrode disposed in said chamber;
    c) a second electrode disposed in said chamber and spaced from said first electrode; said second electrode having a first end and a second end;
    d) power supply means for generating and sustaining an electric arc between said first and second electrodes which causes surface material on the second electrode to vaporize and be deposited on said articles;
    e) means to sense when an electric arc between said first and second electrodes approaches said first or second end of said second electrode;
    f) means to connect a first side of said power supply means to said first electrode; and,
    g) means to connect selectively a second side of said power supply means to either said first end or said second end of said second electrode, said means to connect selectively being responsive to said means to sense so that when an arc approaches said first end of said second electrode, said means to connect selectively connects the second side of said power supply means to said second end of said second electrode, and when an arc approaches said second end of said second electrode, said means to connect selectively connects the second side of said power supply means to said first end of said second electrode, whereby, an electric arc formed between said first and second electrodes is caused to travel back and forth between said first and second ends of said second electrode.

2. The electric arc vapor deposition device of claim 1, wherein said second electrode is cylindrical in shape so that an arc will spiral around said second electrode as it travels between said first and second ends of said second electrode.

3. The electric arc vapor deposition device of claim 2, wherein said second electrode is hollow and said device further includes means to pass coolant through said second electrode.

4. The electric arc vapor deposition device of claim 1, wherein said first electrode is an anode, said second electrode is a cathode, and wherein said anode is approximately ¼ to 4 times the size of said cathode.

5. The electric arc vapor deposition device of claim 4, wherein said anode and cathode are spaced from one another by a distance of approximately 12 inches or more.

6. The electric arc vapor deposition device of claim 1, wherein said means to sense comprises first and second arc proximity sensors which are adjustably positioned adjacent the length of said second electrode.

7. The electric arc vapor deposition device of claim wherein said second electrode is centrally located in said chamber, and wherein said device further includes:
    h) a plurality of means to support articles to be coated within sid chamber, said plurality of means to support being evenly spaced around said second electrode.

8. An electric arc vapor deposition device for coating the inner surfaces of hollow articles comprising:
    a) a chamber for receiving a hollow article to be coated;
    b) a first electrode disposed in said chamber;
    c) a second electrode having a first end and a second end;
    d) means to support said second electrode in said chamber within a hollow article to be coated;
    e) power supply means connected to said first and second electrodes for generating and sustaining an electric arc between said first and second electrodes which causes surface material on the second electrode to vaporize and be deposited on the inner surface of a hollow article to be coated;
    f) means to sense when an electric arc between said first and second electrodes approaches said first or second end of said second electrode; and,
    g) means to connect selectively a side of said power supply means to either said first end or said second end of said second electrode, said means to connect selectively being responsive to said means to sense so that when an arc approaches said first end of said second electrode, said means to connect selectively connects said side of said power supply means to said second end of said second electrode, and when an arc approaches said second end of said second electrode, said means to connect selectively connects said side of said power supply means to said first end of said second electrode, whereby, an electric arc formed between said first and second electrodes is caused to travel back and forth within a hollow article to be coated and between said first and second ends of said second electrode.

9. The electric arc vapor deposition device of claim 8 wherein said second electrode is cylindrical in shape so that an arc will spiral around said second electrode.

10. The electric arc vapor deposition device of claim 8, wherein said means to sense comprises first and second arc proximity sensors which are adjustably positioned adjacent the length of said second electrode.

11. The electric arc vapor deposition device of claim 8 wherein said first and second electrodes are spaced from one another by at least 12 inches.

* * * * *

UNITED STATES PATENT AND TRADEMARK OFFICE
CERTIFICATE OF CORRECTION

PATENT NO. : 5,037,522

DATED : August 6, 1991

INVENTOR(S) : GARY E. VERGASON

It is certified that error appears in the above-identified patent and that said Letters Patent is hereby corrected as shown below:

Claim 7, column 8, line 29, of the claim, "claim" should read
--claim 1--; and
line 33, of the claim, "sid" should read --said--.

Signed and Sealed this

Sixth Day of June, 1995

*Attest:*

BRUCE LEHMAN

*Attesting Officer*  *Commissioner of Patents and Trademarks*

US005037522B1

REEXAMINATION CERTIFICATE (2941th)

United States Patent [19]

Vergason

[11] B1 5,037,522

[45] Certificate Issued Jul. 2, 1996

[54] ELECTRIC ARC VAPOR DEPOSITION DEVICE

[75] Inventor: Gary E. Vergason, Spencer, N.Y.

[73] Assignee: Vergason Technology, Incorporated, Van Etten, N.Y.

Reexamination Request:
No. 90/004,125, Feb. 5, 1996

Reexamination Certificate for:
Patent No.: 5,037,522
Issued: Aug. 6, 1991
Appl. No.: 556,429
Filed: Jul. 24, 1990

Certificate of Correction issued Jun. 6, 1995.

[51] Int. Cl.$^6$ .................................................... C23C 14/22
[52] U.S. Cl. ............................. 204/298.41; 204/192.38
[58] Field of Search ........................ 204/192.13, 192.38, 204/298.03, 298.41

[56] References Cited

U.S. PATENT DOCUMENTS

| | | | |
|---|---|---|---|
| 3,625,848 | 12/1971 | Snaper | 204/192 |
| 3,783,231 | 1/1974 | Sablev et al. | 204/298.41 X |
| 3,793,179 | 2/1974 | Sablev et al. | 204/298.41 |
| 3,922,214 | 11/1975 | Van Cakenberghe | 204/298 |
| 4,407,712 | 10/1983 | Henshaw et al. | 204/298 |
| 4,430,184 | 2/1984 | Mularie | 204/298.41 X |
| 4,492,845 | 1/1985 | Kljuchko et al. | 204/298.41 X |
| 4,609,564 | 9/1986 | Pinkhasov | 427/37 |
| 4,814,056 | 3/1989 | Welty | 204/298 |
| 4,849,088 | 7/1989 | Voltrop et al. | 204/298 |
| 4,859,489 | 8/1989 | Pinkhasov | 427/37 |

FOREIGN PATENT DOCUMENTS

| | | |
|---|---|---|
| 711787 | 8/1980 | U.S.S.R. . |
| 1257015 | 12/1971 | United Kingdom . |
| 1322670 | 7/1973 | United Kingdom . |

OTHER PUBLICATIONS

Kirichenko et al., Author's Certificate, Soviet Union 461163, "Vaporizer of Metal in a Vacuum", Feb. 2, 1975, 2 pages, Translation (2 pages).

Sablev et al, "Electrical–Arc Vaporizer of Metals with Magnetic Confinement of Cathode Spot", 1976.

*Primary Examiner*—Nam X. Nguyen

[57] ABSTRACT

An electric arc vapor deposition device is disclosed in which the negative side of an arc power supply is switched back and forth between the two ends of a cylindrical cathode to cause an arc struck between an anode and the cathode to travel back and forth along the length of the cathode. Adjustably positioned proximity sensors are disposed adjacent the two ends of the cathode to sense the presence of the arc and cause a switching circuit to change the power supply connection from one cathode end to the other. The cylindrical shape of the cathode causes the arc to spiral around the cathode as it travels along its length thus causing a very uniform erosion of material off of the cathode's surface. Since the arc is allowed to travel substantially along the entire length of the cathode, use of a relatively long cathode permits large articles or quantities of articles to be coated evenly. In addition, the cathode can be coaxially located within a hollow article, such as a tube or pipe, to coat the inner surfaces of the article.

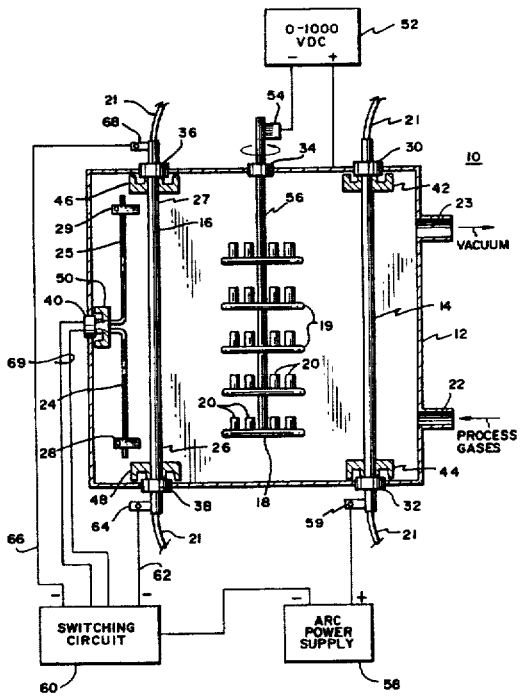

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–11 is confirmed.

* * * * *